United States Patent [19]
Furuto et al.

[11] 3,983,521
[45] Sept. 28, 1976

[54] FLEXIBLE SUPERCONDUCTING COMPOSITE COMPOUND WIRES

[75] Inventors: Yoshio Furuto, Oiso; Takuya Suzuki, Kawasaki; Masaru Ikeda, Tokyo; Yasuzo Tanaka, Yokohama; Shinichiro Meguro, Kawasaki; Takeshi Miura, Yokohama, all of Japan

[73] Assignee: The Furukawa Electric Co., Ltd., Tokyo, Japan

[22] Filed: Sept. 7, 1973

[21] Appl. No.: 395,178

[30] Foreign Application Priority Data

| Sept. 11, 1972 | Japan | 47-91016 |
| Feb. 27, 1973 | Japan | 48-23598 |
| Mar. 13, 1973 | Japan | 48-29303 |
| Nov. 28, 1972 | Japan | 47-119116 |
| Oct. 13, 1972 | Japan | 47-102594 |
| Oct. 13, 1972 | Japan | 47-102593 |
| Oct. 13, 1972 | Japan | 47-102592 |
| Oct. 13, 1972 | Japan | 47-102591 |

[52] U.S. Cl. ............................ 335/216; 174/126 S
[51] Int. Cl.² ......................................... H01F 7/22
[58] Field of Search ............... 335/216; 174/DIG. 6, 174/126 S

[56] References Cited
UNITED STATES PATENTS

| 3,428,925 | 2/1969 | Bogner et al. | 335/216 |
| 3,428,926 | 2/1969 | Bogner et al. | 335/216 |
| 3,502,789 | 3/1970 | Barber et al. | 335/216 X |
| 3,523,361 | 8/1970 | Kinter et al. | 174/DIG. 6 |
| 3,559,128 | 1/1971 | Kingston et al. | 335/216 |
| 3,638,154 | 1/1972 | Sampson et al. | 174/DIG. 6 |
| 3,643,001 | 2/1972 | Schaetti | 174/DIG. 6 |

FOREIGN PATENTS OR APPLICATIONS

| 1,130,464 | 10/1968 | United Kingdom | 174/DIG. 6 |

*Primary Examiner*—George Harris
*Attorney, Agent, or Firm*—Toren, McGeady and Stanger

[57] ABSTRACT

A superconducting compound wire which comprises a plurality of strands having superconducting compound, a part or all of the strands having inclination to the lengthwise direction of the superconducting wire, and the strands being not substantially together with each other.

9 Claims, 34 Drawing Figures

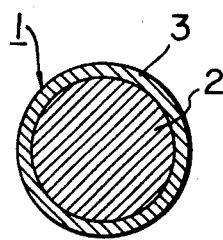
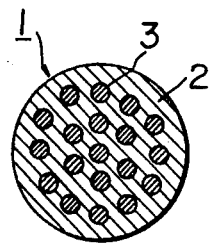
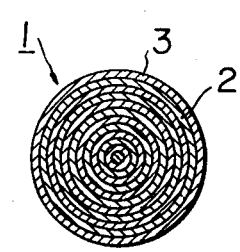
FIG. 1a     FIG. 1b     FIG. 1c
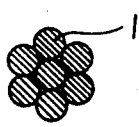
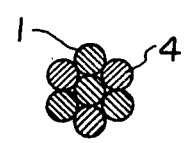
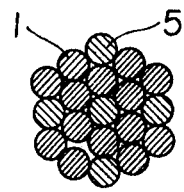
FIG. 2a     FIG. 2b     FIG. 2c
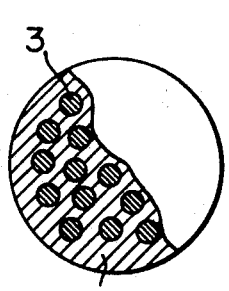
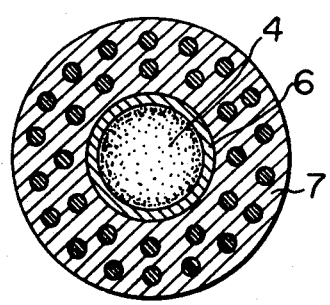
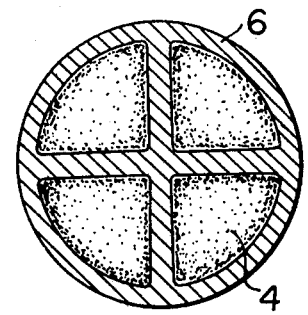
FIG. 3a     FIG. 3b     FIG. 3c
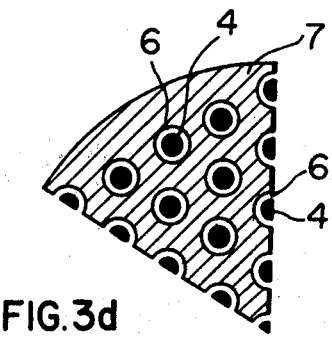
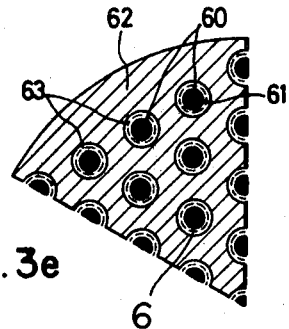
FIG. 3d     FIG. 3e

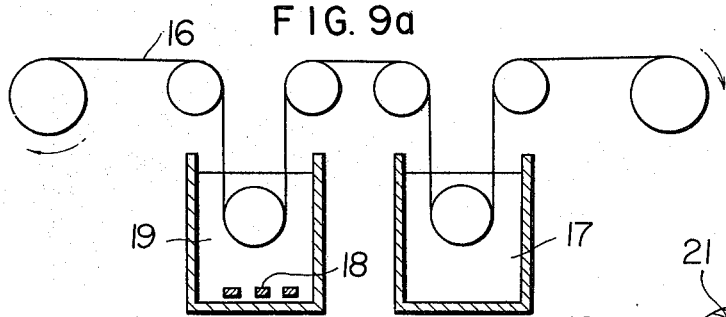
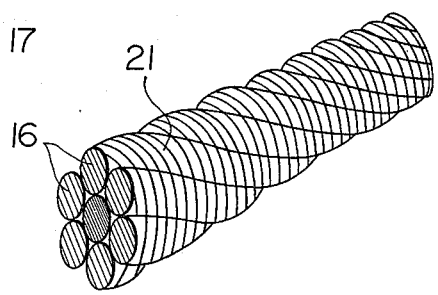
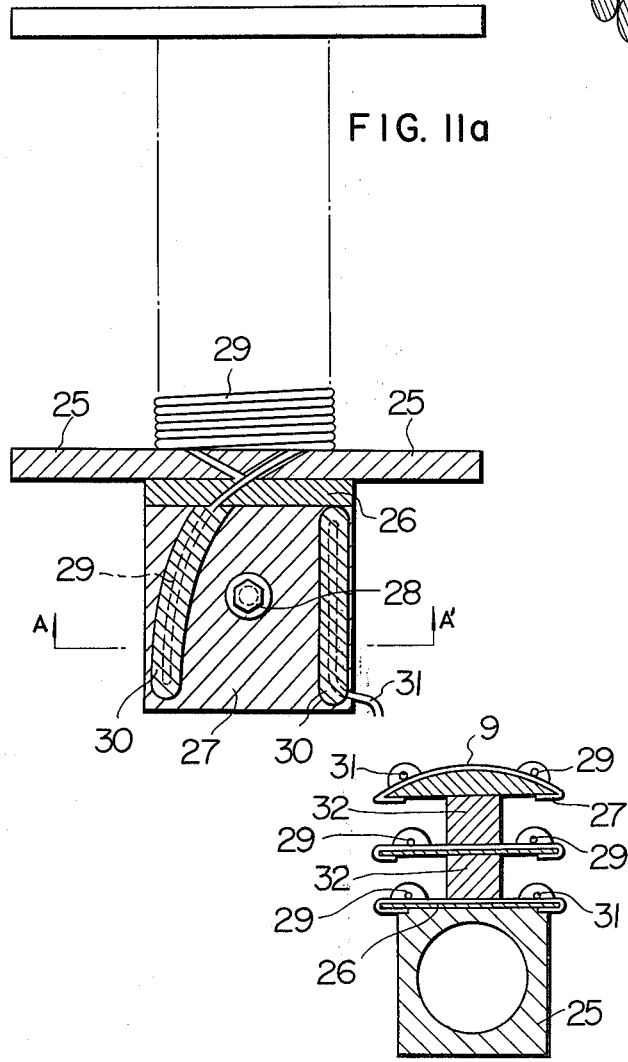
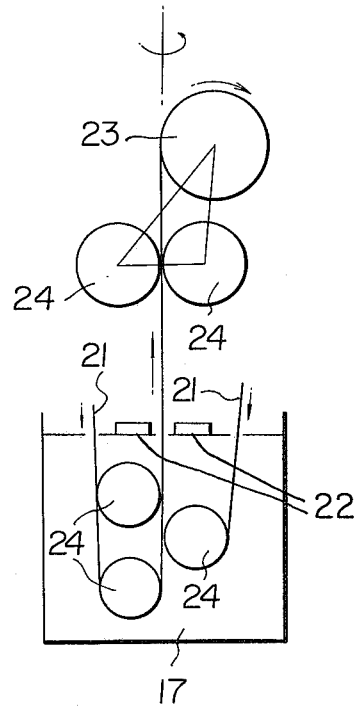

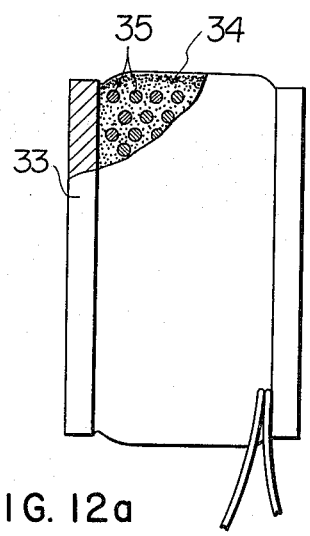
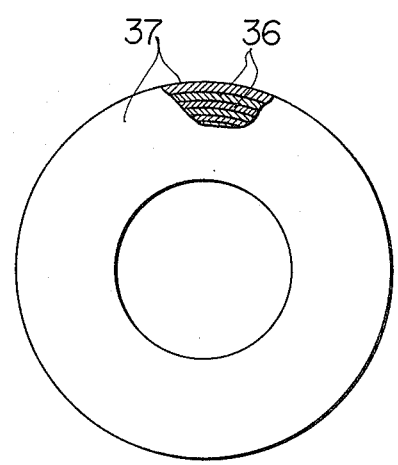
FIG. 12a  FIG. 12b
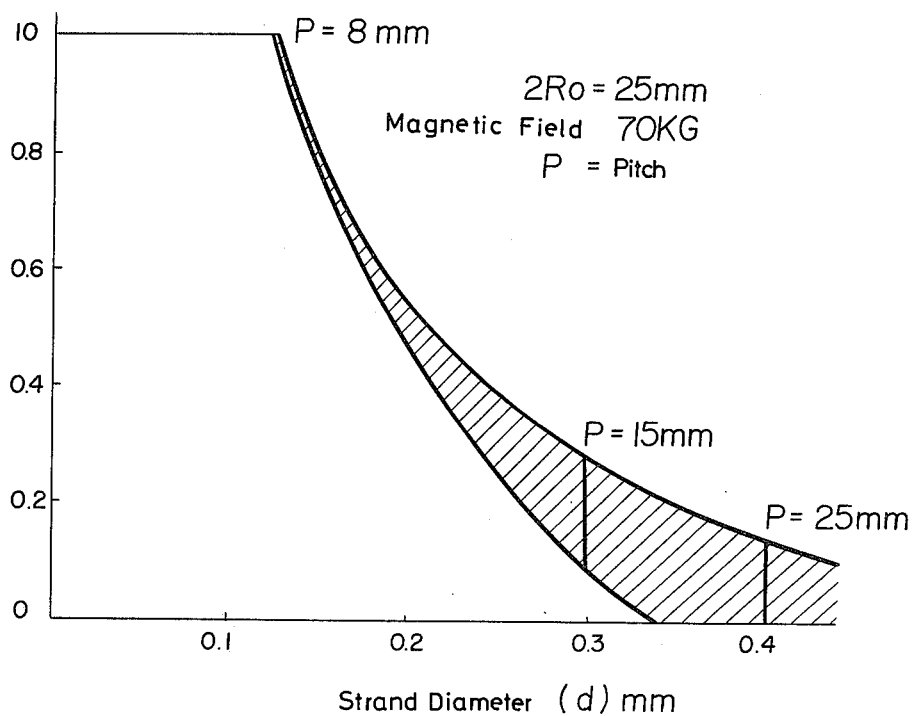
FIG. 13

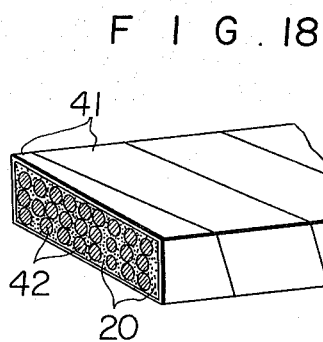
FIG. 18
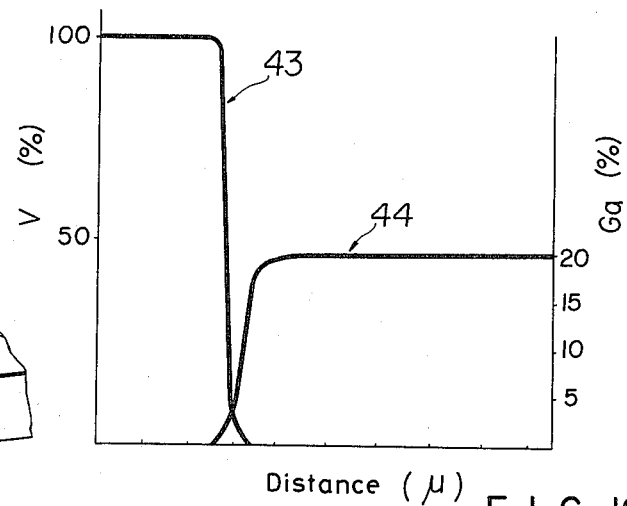
FIG. 19
FIG. 22
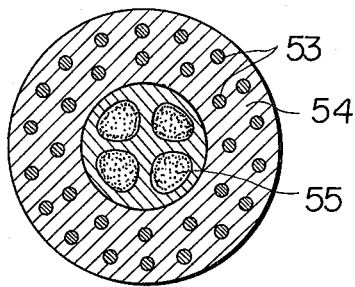
FIG. 20
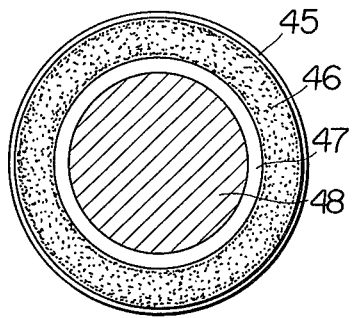
FIG. 23
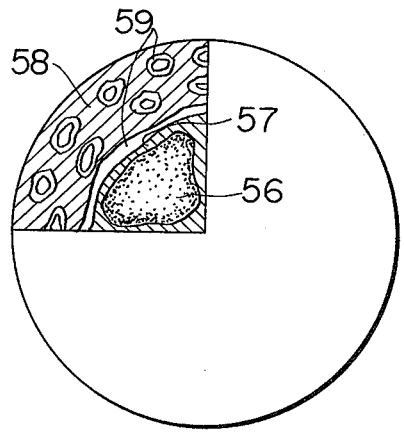
FIG. 21
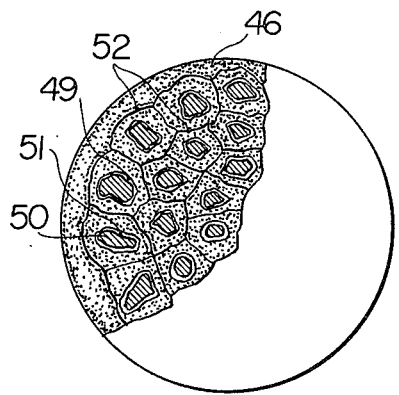

3,983,521

FLEXIBLE SUPERCONDUCTING COMPOSITE COMPOUND WIRES

BACKGROUND OF THE INVENTION

1. Field of the Invention

The present invention relates to flexible superconducting compound wires, such as, stranded wires, braided wires, and transposed wires, composed of a plurality of strands, each having a layer of, superconducting compound and relates to a method for manufacturing thereof.

2. Description of the Prior Art

Various extensive studies have been made on superconducting compounds as wire materials for high magnetic field magnets, since they have very high critical magnetic field ($Hc_2$) as compared with superconducting alloys. Typical superconducting compound include $\beta$-W type compounds, such as, $Nb_3Sn$, $Nb_3Al$, $Nb_3Ga$, $Nb_3(AlGe)$, $V_3Ga$, $V_3Si$; NaCl type compounds, such as, NbN, (NbTi)N, NbC; and Laves phase compounds, such as, $V_2Hf$, $V_2Zr$. Among them only $Nb_3Sn$ and $V_3Ga$ are at present in practical use.

Processing of the superconducting compounds into wires have been always accompanied with the problem of mechanical brittleness and various wire manufacturing methods have been developed and proposed for solving the problem up to now. The representative methods include a composite method (for example, a composite of niobium and tin is subjected to roll processing or wire drawing and then subjected to heat treatment); a surface diffusion method (molten tin or garium is coated on vanadium or niobium base and the coated metal base is subjected to a diffusion heat treatment) and a vapour-phase reduction method (gaseous halide of component elements of a superconducting compound is reduced by hydrogen to form the compound on the base). Other methods such as a reactive spattering method and a plasma spray method may be mentioned.

Wire coils of superconducting compound produced by these conventional methods have been in practical use only in the form of tape.

The conventional superconducting compound in the tape shape, however, have the following defects which can not be avoided essentially.

The first defect is that the tape shaped superconductor cannot be coiled around the magnet bobbin in solenoidal winding so that the magnet must be made by arranging a required number of Baumkuchen-like coils or pan-cake type coils.

Secondarily, there is a problem of the structural anisotropy causing anisotropy in the critical current and, as a result of the coil performance. The second defect is that the so-called pinning force of the magnet lowers in the magnetic field direction perpendicular to the tape surface, that is, at the end portions of the magnet so that instability is caused.

Thirdly, there is a problem of irregularity in the magnetic field when the tape is used as a magnet coil. In case the magnetic field intensity changes along the width of the tape, the current flows more to portions of the weak magnetic field so that the current density is not uniform, thus causing disorder of the magnetic field distribution. Further, there are always spaces between the pan-cake type coils, and disorder of the magnetic field distribution is induced by these spaces. Thus, a highly uniform magnet cannot be made from the tape shaped coils.

As a fourth defect, the total packing factor can never be increased. The total current density of the magnet as a whole lowers if the coiled wires have the same current density because a magnet of pan-cake type has a low packing factor as mentioned before. Further, in the case of a pan-cake type coil, the number of coils to form a magnet is small so that each coil must be of a large current type. As a result, it is necessary to provide a large amount of stabilizing materials which, in turn, causes lowering of the average current density.

As a fifth defect, the tape shaped superconductor has difficulty in respect of compatibility with the conventional NbTi alloy wire. Thus, from point of economic design of the magnet, it is most preferable to use superconducting compound wires, stable in a high magnetic field, for the core portion of the magnet which is the high magnetic field zone, and use inexpensive NbTi wire for the outer, middle and low magnetic field zones. However, the conventional tape shaped superconductor must be in the form of a pan-cake type coil so that there are difficulties in respect of the structural compatibility of both coils. Further, the tape shaped superconductor must be of a large current type as mentioned above so that it is difficult to obtain the current matching of both types of the coils.

Therefore, an object of the present invention is to provide superconducting compound wires having excellent flexibility which can be handled just as superconducting alloy wires.

Another object of the present invention is to provide a superconducting stranded, woven and transposed compound wires having excellent flexibility.

Still another object of the present invention is to provide flexible superconducting compound wires suitable for use in a magnet.

Still another object of the present invention is to provide a method for manufacturing the above superconducting compound wires having excellent flexibility.

According to the present invention, there are provided superconducting compound wires wherein some or all of the plural strands having a continuous layer of superconducting compound are assembled in such a manner as to have a certain inclination to the lengthwise direction of the superconducting compound wires, and the strands do not substantially adhere to each other.

The present invention also provides a method for the manufacture of superconducting compound wires, which comprises assembling together some or all of strands having a compound layer formed by a heat treatment, in such a manner that they have a certain inclination to the lengthwise direction of the superconducting compound wires, heating the assembled strands to a temperature for forming the compound, and cooling the strands.

The wires in which the strands are assembled together so as to have an inclination to the lengthwise direction of the wires include stranded wires, woven wires, and also transposed wires, any other wires in which not all of the component strands are assembled in parallel to the lengthwise direction of the wire.

DESCRIPTION OF THE DRAWINGS:

Typical examples of the present invention will now be more fully described with reference to the accompanying drawings in which;

FIG. 1 shows a cross sectional view of strands having superconducting compound layer of the superconducting compound wire.

FIG. 2 shows a cross sectional view of the superconducting compound stranded wires.

FIGS. 3 to 5 show a cross sectional view of strands of the stabilized superconducting compound wire.

FIG. 9 shows (a) a conceptual drawing of the process to be used for acid pickling and molten plating with soft metal in the manufacturing of the superconducting compound wire, and (b) a perspective view of an example of the superconducting compound wire.

FIG. 10 shows a conceptual drawing of the production process of the superconducting compound cable with large current capacity.

FIG. 11 shows (a) a plan view of jointed portion of the superconducting compound wire, and (b) a cross-sectional view on line A - A' of the jointed portion.

FIG. 12 shows plan and side views of the jointed portion of the superconducting cmpound wire.

FIG. 13 shows relationship between strand diameter and normalized critical current of the superconducting compound wire.

FIG. 18 is a perspective view of a large current capacity compound cable.

FIG. 19 shows X-ray micro analysis chart of the CuGa-V composite bar having an oxide layer on its V-cores.

FIG. 20 shows a cross sectional view of the strating bar composing a composite strand.

FIG. 21 shows a cross sectional view of the superconducting strand with a high resistance layer.

FIG. 22 shows a cross sectional view of a strand having silver as a stabilizing material at the center of strand.

FIG. 23 shows a cross sectional view of the strand shown in FIG. 21 after heat treatment.

Figure 4A:
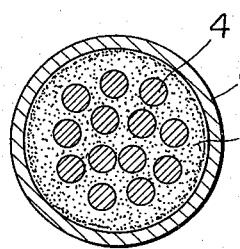

The superconducting wires according to the present invention are characterized in that some or all of the plural strands having a continuous layer of superconducting compound are assembled in such a manner as to have a certain inclination to the lengthwise direction of the superconducting wire and that the strands do not substantially adhere to each other.

As for the strands having the layer of superconducting compound according to the present invention, the strand 1 as shown in FIG. 1-a, composed of a base 2 and a single layer 3 of superconducting compound; the multicored strand 1 as shown in FIG. 3-b, composed of a base 2 having multiple layers 3 of superconducting compound therein; and the multi-layered strand 1 as shown in FIG. 3-c, composed of multiple layers of a base layer 2 and a superconducting compound layer 3 are desirable from the point of flexibility and packing factor.

The superconducting wires according to the present invention will be explained in the case of a stranded wire.

The wires have a cross-sectional structure as shown in FIG. 2. (a), (b) and (c) wherein wires composed of the strands 1 having a layer of superconducting compound, the strands 4 of stabilization material such as copper, silver, gold and indium, and the strands of reinforcing material 5 such as stainless steel, tungsten, molybdenum, carbon and alumina. In these cases the strands (7, 19 and 37 . . . ) are stranded in a close-packed arrangement. The close-packed arrangement is desired from the point of packing factor, but the present invention should not be limited thereto.

In addition to the above stranded wires, the composite superconducting wires of the present invention include woven wires, transposed wires, S.Z. stranded wires and wires in which strands are assembled by various combinations of these assembling methods.

As above described, in the superconducting wires of the present invention, since some or all of the strands are assembled so as to have an inclination to the lengthwise direction of the wire, the magnetic field intensity given to each strand is equallized so that the current passing through the strands is uniform and thus the instability of the coil as a whole is eliminated. Thus the present invention has solved the essential defects of the conventional tape shaped superconductors, namely, the instability due to the anisotropy in the critical current and the non-uniformity of the current distribution in the width direction.

One of the advantages of the present invention is that the superconducting wire has flexibility due to the fact that the component strands are not integrated closely with each other. Therefore, in contrast to the conventional tape shaped superconductor, the wires according to the present invention can be wound around the magnet bobbin just as the superconducting metal alloy wires. In case of a hybrid magnet where the wire of the present invention is used with superconducting metal alloy wire, it is possible to equalize the currents passing through both wires. Further, as the component strands cross each other in multi-levels at a fixed interval along the length of the wire, the coupling current flowing across the strands induced by rapid changes in the magnetic field is cut, so that wires of the present invention can be used safely in alternating current applications.

Next, the method according to the present invention will be described hereinunder.

As the compound superconductors are very brittle as compared with metal superconductors, it is impossible to strand or to braid strands having a layer of such compound. In the case of strands having a layer of compound, the layer of compound cracks during the stranding or braiding process due to remarkably large bending stress and twisting stress even when the layer is considerably thin. Therefore, the conventional art has been limited to the tape shaped single wire composed of a tape-like metal base having a layer of compound thereon.

According to the present invention, the strands in which a superconducting compound layer is to be formed by heat treatment are assembled into desired wires such as stranded wires and braided wires prior to the formation of the compound, and then the strands are subjected to heat treatment to form the superconducting compound layer. In this point, it is most important to avoid the adhesion and integration of the strands due to the mutual diffusion caused by the heat treatment between adjacent strands. Otherwise it is impossible to obtain superconducting wires having excellent flexibility. Therefore, according to the present invention, substances which can prevent the mutual diffusion between the adjacent strands when subjected to the heat treatment are laid between the strands.

As for the substances for prevention of the mutual diffusion, metal oxides, ceramics, carbon and other substances which show less mutual diffusion at high temperatures during the heat treatment for formation of the compound can be used and may be selected considering factors such as the temperature of the heat treatment and the strand material. These substances can be formed on the surface of the strand or laid between the strands by chemical or mechanical treatments. For example, the oxide layer can be formed on the surface of the strand by subjecting the assembled strands to an oxidation treatment, or the metal oxide can be applied on the surface of the strand, or an organic compound is applied on the strand surface and a carbon layer is formed by thermal decomposition. Further, when metals such as tungsten, molybdenum and platinum which are stable at high temperatures are used as such substances in the present invention, these metals may be applied on the strand surface by plating etc. or wires of these metals may be assembled together with the strands in such a manner that these wires function as reinforcing strands 5 shown in FIG. 2-c and at the same time functon as the substances.

When strands whose outer most layer is composed of metals such as copper and copper alloy which form oxide easily are used as illustrated in the examples, it is very easy and practical to form the oxide layer on the surface of the individual strands by heat treatment in an oxidizing atmosphere or by chemical treatment after the strands are assembled. In particular, in order to form the oxide layer, it is also advantageous to bring the strand surface into contact with the oxidizing atmosphere at the initial stage of heat treatment for formation of the compound. Further, after the superconducting compound layer has been formed in the strands according to the present invention, the substance for prevention of mutual diffusion may be removed by a chemical or mechanical method. For example, in order to further improve the stability of the superconductivity of the superconducting wires of the present invention, the substance is removed and the interstices between the strands are filled with soft stabilizing metals such as indium, tin and lead which do not damage the flexibility of the superconducting wires of the present invention. For this purpose, the substances and the methods of introducing such materials between the strands should be selected appropriately.

Next, the structure of the strands before heat treatment used in the present invention will be described in detail.

In case of the superconducting wires of the present invention, as the desired superconducting compound layer is formed by the heat treatment after the strands are assembled, considerations have been made in the following points in respect of the structure of the strands and the assembling of the strands. The reaction in the final heat treatment should be predominately a diffusion reaction of the component element for forming the desired superconducting compound, and such reactions which delay the formation of the superconducting compound, lower the stability of the superconductor due to the diffusion reaction, or cause adhesion of the strands due to the mutual diffusion should be avoided.

The following structures of the strands are desirable for the above reasons.

As for the structure of the strand intended to increase the surface area for the formation of the compound and the stability, and the structure intended to facilitate the subsequent chemical treatment and dipcoating, the structure as shown in FIG. 3-a is desirable. In this structure, either of niobium or vanadium 3 among the elements composing the desired superconducting compound is embedded in the matrix of other elements or alloy containing the other elements.

Further, in order to improve the stability, to obtain perfect contact between the component metals by mechanical working such as swaying, drawing and rolling prior to the diffusion heat treatment, and to prevent lowering in the purity of the stabilizing materials during the diffusion treatment, the structure as shown in FIG. 3-b is desirable. In this structure, there is a layer 6 of either of niobium or vanadium tightly adhering to the outside of the stabilizing material 4 composed of at least one of copper, silver, aluminium and gold and further there is a matrix 7 of other elements or their alloys which react with either of niobium or vanadium to produce the desired superconducting compound, the matrix 7 tightly adhering to the outside of the layer 6. The interior of the stabilizing material 4 may as shown in FIG. 3-c, be provided with a continuous phase of a metal 6 selected from the group of niobium, vanadium, and their alloys. In this case, almost no mutual diffusion between niobium or vanadium and the stabilizing metals takes place so that the purity of the stabilizing materials does not lower and good electrical and thermal conductivity of the stabilizing materials per se can be assured, and it is possible to produce a stabilized strand having remarkably low electrical and thermal resistance of the stabilizing materials and the layer of superconducting compound because of the complete adhesion obtained by the mechanical working as mentioned above. Further, as the practical thickness of the stabilization metals is large as compared with the case where the stabilizing materials are provided at the outer side of the layer of the superconducting compound, advantages are obtained in respect of the size effect in the electrical resistance and the magnetic resistance effect. As the layer of elements which react with niobium, vanadium or their alloys to produce the superconducting compound or alloy is provided outside of the layer composed mainly of niobium, vanadium or their alloys which is provided outside the layer of the stabilizing materials, the surface area for the diffusion reaction is large as compared with the case where the matrix is provided at the inner side of the layer so that a large amount of the diffusion reaction layer can be formed on the outside of the layer in a shorter time. When the same cross sectional area of the superconducting compound layer is to be formed, the effective thickness of the layer can be reduced for the above reason. Thus excellent adiabatic stability and dynamic stability can be obtained. As used herein, adiabatic stability means that property which prevents instability in which the superconductor is heated adiabatically as a result of flux jump and the magnetic flux intrudes further into the superconductor to cause heat. The dynamic stability means the nature which prevents the similar instability when the heat generated in the superconductor is transmitted through a normal conductive material. Also it is possible to prevent contamination by the atmosphere of the treatments such as the diffusion treatment, because the stabilizing materials are not exposed to the atmosphere. The structure shown in FIG. 3-c can prevent sheath cracking or break-down in the stabilizing materials due to mechanical workings, and further the strand having the structure shown in FIG. 3-d, when the superconducting compound is formed on the interface between niobium or vanadium 6 and matrix 7 comprising other elements, is turned into a three-component structure in which the superconducting compound layers are divided from one another alternately by either layers of stabilizing material 4 or layers of matrix 7 having a high electrical resistance and accordingly given a function of decoupling loop current resulting from sharp change in magnetic field and, therefore, a stability in alternate current applications.

Figure 4B:
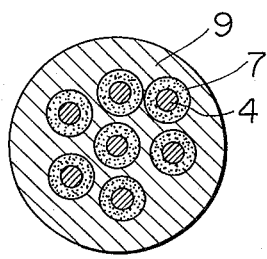

As a desired structure of the strand for promoting the formation of the superconducting compound, the structures as shown in FIGS. 4-a and 4-b may be considered, in which a copper layer 7 is provided tightly adhering to the vanadium or vanadium alloy 4 and a silver layer 9 is provided tightly adhering to the copper layer, and at least one of the copper layer and the silver layer contains 0.1 to 30 atomic per cent of gallium. These structures promote the diffusion of gallium, remarkably accelerating formation of $V_3Ga$ and increasing the thickness of compound layer as compered with the case where no silver exsits. Therefore it is possible not only to use gallium effectively but also to supply gallium at later stages when the initial gallium content is low. For example, copper-gallium alloy and silver-gallium alloy show sever work hardening even when the gallium content is about 10% so that these alloys must be subjected to intermediate annealings for production of strands therefrom. But according to the present invention, the gallium content in the starting material is maintained to several (about 3 – 8) per cent and the material is processed into strands almost only by cold working and then the strands are passed through molten silver-gallium alloy to dip-coat the strands, thereby gallium being supplied into the strands.

Next, the methods for producing the composite strand used in the present invention will be described hereinafter.

Figure 5:
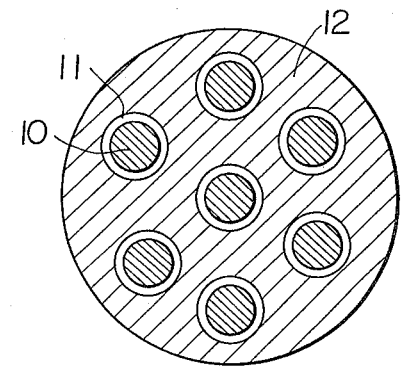

The strand is made by putting upright in a mold the bar of one metal component having a higher melting point than the other component of the superconducting compound and then pouring melt of the other metal components into the mold and rapidly cooling the melt and composite stock thus obtained is subjected to mechanical working into strands. The components having a higher melting point and the components having a lower melting point react with each other on the composite contact surface under the high temperature condition such as during casting, hot extrusion and intermediate annealing. In this case prior to the casting processing, it is preferred to form a very thin film of oxide on the surface of the bar of the metal having a higher melting point in order to prevent formation of compounds which causes very poor workability. This thin oxide film is easily broken during the working and does not bother the workability. In case where the temperature of the heat treatment for the compound formation is high or the temperature required during the above mentioned processing is high, as is shown in FIG. 5 a thin coating layer 11 of copper or silver is applied to the outside of the bar 10 of the metal having a higher melting point and then melt 12 of alloy of the low melting point metal with copper or silver is poured and cooled to obtain a composite stock, which is worked into a strand. According to this method, cold workings such as die drawing for the preparation of bars of the high melting point metal is faciliated by applying a thin sheath of copper or silver to the starting bars thereby improving wetting property of the metal so that sound ingots can be obtained. Further, copper and silver used as the sheath are soft so that the adhesion between the high melting point metal component and the other metals component is improved.

All of the above methods for producing strand are casting methods, but the present invention should not be limited to the casting methods. For example, after a composite bar composed of the high melting point metal component bar 10 and the coating layer 11 of copper or silver outside the metal bar 10 is obtained, the alloy billet of the low melting point metal component with copper or silver is drilled and the composite bars are inserted into these drilled holes and then the billet is subjected to mechanical working into a strand. Another method is through the use of well-known method which is carried out from the preparation of composite alloy superconductor. A bar of one of the component metals of the superconducting compound is inserted into an alloy tube containing the other metal component and then a plurality of these composite bars are further inserted into a metal tube which is subjected to mechanical working into a strand.

The above mentioned sheathed composite bar may be made by inserting a bar of the high melting point metal component into a copper or silver tube and making them adhere to each other mechanically, or by electro-plating copper or silver on the bar, or by dipping the bar in a molten silver or copper.

The strand preparation by mechanical working includes ordinary metal workings such as hot extrusion, liquid pressure extrusion, swaging, groove rolling, hot wire drawing, cold wire drawing. Especially, in case of the present composite stock where the treatments for temporarily preventing the formation of the compound at high temperatures are given, hot extrusion or liquid pressure extrusion is useful because a high rate of reduction can be selected.

The method for assembling the strands will be described hereinafter.

The method for assembling the strands used in the present invention is to incline some or all of the strands in respect to the lengthwise direction of the superconducting wire, and it is natural that the degree of the inclination should be determined according to the diameter of the strand and the allowable bending diameter of the superconducting wire. Elongation of an ordinary superconducting compound is only about 0.2%, and it is necessary to regulate the degree of deformations such as bending and stretching within the allowable limit.

The present invention will be described in connection with the most simple stranded wire of seven strands. The stranding must be done in such a manner that the outer diameter d of the strand is smaller than the product of the allowable bending diameter $D_o$ (for example coil diameter) of the superconducting wire and the strain limit $\epsilon$ for avoiding degradation of the superconductivity of the strands, and that the length of the stranding pitch is within the range from 20 to 1000 times of the strand diameter. Namely the strand diameter d should be within the range determined by the formula $d < D_o\epsilon$. In case of $V_3Ga$ stranded wire, for example, an experimental formula of $d < 0.008D_o$ has been obtained from experiments.

When seven of the strands are stranded together, the minimum stranding pitch is geometrically six times the strand diameter. Considering the tension, compression, and twisting stress given to the stranded wire in its actual use, it is however necessary that the minimum stranding pitch is at least 20 times the strand diameter, and in order to maintain the desired shape of the stranded wire and to prevent its colapse when the strands are coiled it is desirable that the maximum pitch is not more than 1000 times of the strand diameter.

The stranded wires according to the present invention can be handled just same as the conventional alloy superconducting wires. And due to the nature of the stranded wire, the present wires have flexibility more than 10 times of that of the solid wire of the same diameter, and are very easy to handle and more advantageous than the conventional tape-shaped superconductors.

Next, descriptions will be made of the assembling of the strands in which reinforcing materials are used.

It is impossible to avoid the deformation due to the facts that the wires are in a bent state in the final coil form and when the coil is excited the wires are subjected to complicated forces due to the electromagnetic force. As mentioned above, the compound itself is destroyed by elongation of about 0.2% so that it is necessary to control within this limit the deformations of the compound due to the handling, the electromagnetic force, etc. Therefore when it is estimated that deformations exceeding this limit the reinforcing materials are required. Under such condition, the present invention provides superconducting wires reinforced at least in its center portion. In practice, the force given to the wire strands during the production process after the formation of superconducting compound and the coiling process is 3 to 4 kg/mm², while the force imposed to the wire during the excitation is about 2.5 kg/mm² at a magnetic field of 100 KG in the direction of the circumference of the coil. On the other hand, the tension limit of the superconducting wires of the present invention which does not cause the degradation of superconductivity of the compound is about 30 kg/mm² without any reinforcement. Accordingly if a safety factor of 10 times is required in consideration of emergency, such a reinforcement will be good enough for the wire as will increase its strength twofold.

Figure 6:
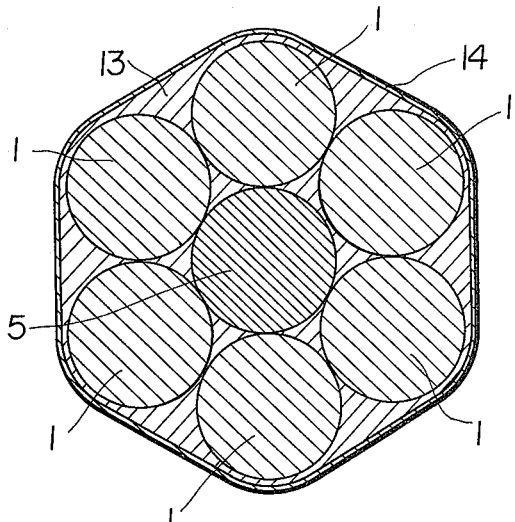
FIGS. 6 and 7 show a cross sectional view of the superconducting compound stranded wires.

The representative example of the reinforced composite superconducting wires of the present invention is as shown in FIG. 6, in which six strands 1, internal structure not illustrated each containing the superconducting compound layer are stranded around the reinforcing material 5 of the same diameter, and the voids therebetween are filled with soft metal 13. The wire is coated with an insulating coating film 14.

As a modification of the strand assembling method of the present invention, the surfaces of the assembled strands are smoothed by wire drawing or rolling etc. Accordingly, the periphery of the assembled strands is almost circular without sacrificing their inherent flexibility so that the instability due to the mutual displacement of the strands caused by the excitation can be removed, and as the surface irregularities of the assembled strands are smoothed, the superconducting wires are sufficiently exempt from local damages by handling and are saved by about 10% in space factor in the coiling step and thus very advantageous as magnet wires.

Descriptions will be made on the heat treatment for the formation of superconducting compound of the assembled strands of the present invention hereinunder.

In order to maintain the flexibility of the superconducting compound wires, it is, as previously mentioned, necessary to avoid mutual adhesion of the strands during the long time heat treatment. The basic principle of the method, therefore, is slightly to oxidize the strand surface beforehand or to use the substances to prevent the adhesion. The present invention provides the following effective heat treatment method suitable for elongated assembled strands.

Figure 8:
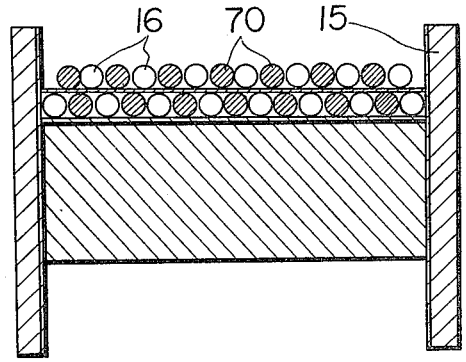
FIG. 8 shows the schematic arrangement for heat treatment of the assembled strands to be formed into the superconducting wires.
Figure 14:
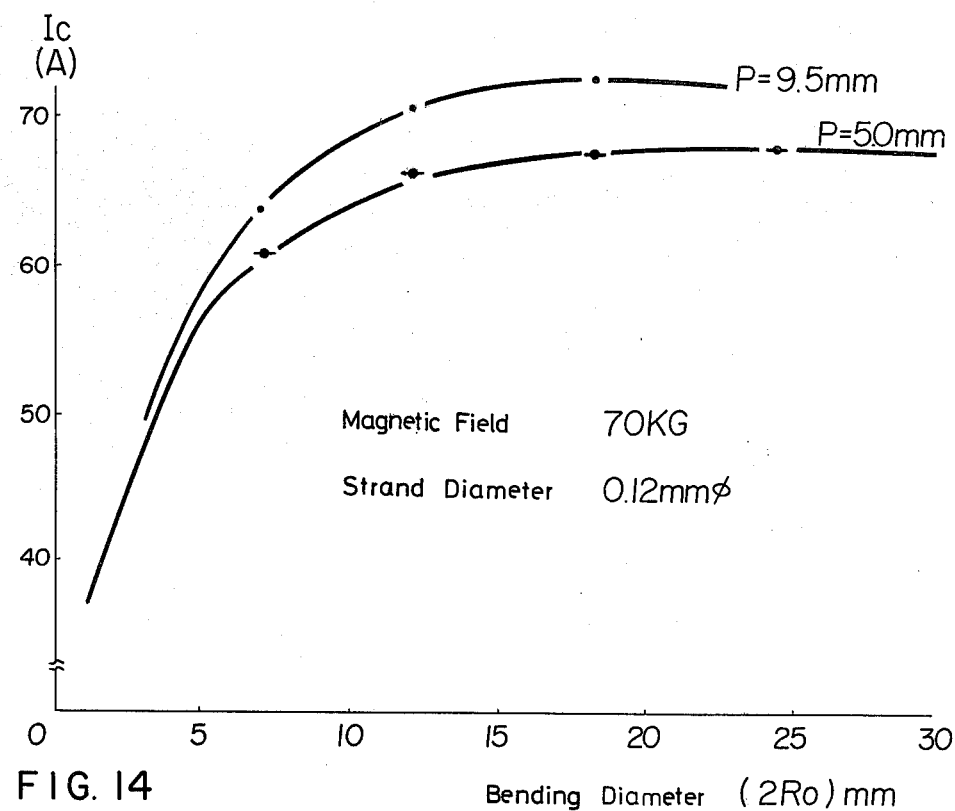
FIG. 14 shows relationship between the bending diameter and critical current of the superconducting compound stranded wire.
Figure 15:
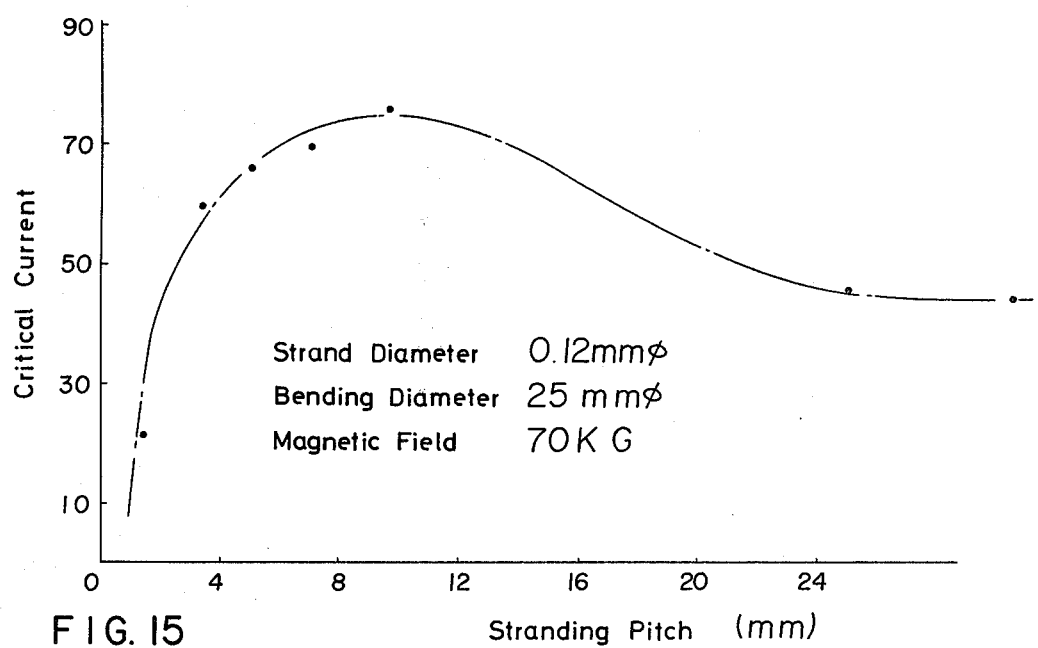
FIG. 15 shows relationship between stranding pitch and critical current of the supersensiting compound stranded wire.

This heat treatment comprises winding the assembled strands around a frame applied with substance which does not react with the strands in the subsequent heat treatment and heating the assembled strands at a temperature sufficient to form a desired superconducting compound. In this case, when the assembled strands are wound 16 in multiple layers around the frame 15 as shown in FIG. 8, a spacer 70 having the substance which does not react with the assembled strands may be inserted between the turns and the layers. What is important in this point is to minimize the heat capacities of the frame and the spacer as much as possible so as not to hinder the heat transfer to the assembled strands, and the substance must be selected considering the thermal expansion coefficients of the assembled strands and the superconducting compound to be formed. For example, in case of $V_3Ga$, it is desirable to use mild steel frame and spacer wire and foil, all coated with carbon.

According to the present invention, there is no problem of change in the cross sectional shape or entanglement of the assembled strands and it is possible to form the superconducting compound in uniform thickness in the lengthwise direction of the wire thus obtained. According to a modification of the present invention, after the superconducting compound has been formed the wires as wound around the frame are fixed by vacuum soaking with grease or epoxy resin in order to prevent instability due to the mechanical vibration among the strands and improve the contact with the cooling medium and in this way the stranded wire can be used directly as a superconducting magnet. According to this modification, the coiling step is remarkably facilitated and the characteristics of the superconducting compound are not degraded because no working such as bending and stretching is given.

Further, the present invention provides the conditions for the heat treatment of the assembled strands.

Conventionally, although the composites to be changed into compound have been subjected to the temperature for the time required for formation of the superconducting compound in the heating treatment, the characteristics (particularly critical current) of the obtained superconducting compound are extremely low or accompanied with considerable deviation. This is due to the fact that enough consideraton has not been taken to the conditions in the cooling step after the superconducting compound has been formed at the high temperatures in the inside or outside of the composite stock composed of several materials having different physical and mechanical properties.

The basic materials of the composite stock have different thermal expansion coefficients which are usually lower by one unit in the compound although similar in the metal portions. And under the high temperature condition, the deformation resistance of the metals are remarkably lowered. On the other hand, the ordinary superconducting compound has a high melting point so that lowering of its deformation resistance at the heat treatment temperature cannot be expected so much, and thus embrittlement is caused, although its deformation resistance remarkably lowers at a temperature higher than the half of its melting point. Also the compound immediately after its formation has many lattice defects such as vacancies and has many disordering factors so that its strength is relatively poor. In practice, when these basic materials are compounded at high temperatures and cooled from the state free from the thermal stress and deformation stress, the thermal and deformation stress is stored in the composite stock, because the transfer from the high temperature state of the composite stock to the low temperature state can not be effected completely and the cooling rate is practically limited so that relief of the thermal stress due to thermal creep and the deformation stress can not be effected in good time. As a result, shearing force is caused at the intersurfaces in the composite stock, and thus if it exceeds the destruction stress limit of the compound, the compound is destructed. As this phenomenon takes place when the cooling rate is relatively low, this phenomenon is remarkable when the water cooling or air cooling is done at high cooling rate. In case of such a rapid cooling difference is caused in the thermal absorption between the inside and the outside of the composite stock so that tension stress near the surface causes thermal stress as compression stress to the center portion. Further, as a secondary destruction factor for the compound, the thermal and deformation stresses as above tend to concentrate at the interface between the compound and the matrix, so that it is possible that very small cracks such as Griffith cracks are caused in view of the anisotropy in the grain growth of the compound, the irregularity at grain boundaries and convexes and concaves appearing at the boundaries of the matrix. If the compound is stripped off from the matrix, the notch effect becomes still more remarkable. Therefore, the present invention provides the heat treatment which reduces the destruction of the compound caused by the above factors. The heat treatment of the present invention is to give the compound a slow cooling fully from the temperature at which the compound has been formed, and in case of the stocks where the superconducting compound is formed by ordering after the formation of the compound, the present heat treatment is done holding the stock for a time necessary for the ordering and then slow cooling the stock as above.

The cooling rate in the heat treatment of the present invention depends also on the heat capacity of the composite superconductor, but in case of superconductors having a thermal diffusion distance of about 10 mm, the theoretical maximum cooling rate is 1° to 10°C/min. As the diameter of the actual superconducting wire is small and the heat capacity is relatively small and thus a large temperature difference is hardly caused between the surface and the inside of the conductor by an ordinary heat treatment so that the cooling rate is determined by the relieving speed of the stored internal stress by thermal creep and the destruction strength of the composite basic materials. Namely at higher temperatures where the relief by thermal creep is relatively high, it depends on the strength of the basic materials and at low temperatures where the relief is relatively small, the thermal absorption among the basic materials is relatively small and the cooling rate is not substantially influenced. In general, it is desirable to make the cooling in the range from the compound formation temperature (°K) to its half temperature as slow as possible, and at a cooling rate of several degrees per minute the compound is not substantially damaged. Therefore, the cooling rate after the heat treatment of the composite superconducting wire is preferably several degrees per minute.

According to the heat treatment of the present invention, the superconducting compound formed by the heat treatment is brought down to normal temperatures without destruction so that a composite superconducting wire showing the inherent characteristics of the superconducting compound can be obtained.

Further, according to the present invention, after the composite superconducting wire is obtained as mentioned above, the wire is insulated using organic materials etc. for safety. The wire thus obtained is well useful as a stabilized composite superconducting wire. However, when more stability is required as by a conductors to be used in a high magnetic field and by large conductors for magnets, the following method can be applied.

The composite superconducting wire of the present invention is characterized in that the component strands do not adhere to each other and has excellent flexibility. This property is not substantially damaged by the coating of soft metal such as indium, for example, on the assembled strands so that it is possible to provide a stabilized composite superconducting wire in which at least the outermost portions of the assembled strands is coated with the soft metal. The representative example of the composite superconducting wire coated with a stabilizing metal is shown in FIG. 6. As for the method for coating the soft metals, the dip coating is advantageous since these metals have low melting point.

In this case it is desirable to pass the assembled strands through an acid pickling step provided in succession in advance of the dip coating step. This acid pickling is to remove a thin oxide film formed on the wire surface while the wire is dried or left in an atmosphere, the wire has been cooled after the heat treatment and the surface oxide film has been removed by acid pickling. And when the dip coating is done successively after this acid pickling step, good flowability of the molten metal is assured and a uniform coating film is obtained. The present invention provides a method for coating the molten metal more uniformly and efficiently. Namely, as for the method for coating the molten metal moves uniformly and is acid pickled in a solution 19 mixed with fragments of indium prior to passage through the molten indium bath 17 as shown in FIG. 9-a, or a metal wire 21 which is easily coated with indium is wound around the surface of the composite superconducting wire prior to the passage through the molten indium bath 17 as shown in FIG. 9-b.

The reason for the use of fragments of indium in the former process is that the indium in the acid pickling solution becomes ionic and which precipitates thinnly on the surface of the composite superconducting wire while the surface of the superconductor is dissolved into ions and the elements having small ionization tendency are precipitated on indium to promote the acid pickling of the composite superconducting wire. The reason for the use of the metal wire which is easy to coat with indium in the latter process is that the surface of a metal or alloy which is relatively hard to coat with indium is clamped with a metal wire (such as of Cr and Ni) so as to improve wettability of indium and to obtain a continuous film of indium. The composite superconducting wire stabilized by the indium coating as above is finally insulated by organic compounds. In some cases, a layer of inorganic compound, such as oxides, sulfides and cholrides of indium may be formed as an insulating film on the indium coating. Next descriptions will be made on methods for in creasing the current capacity by further assembling the composite superconducting wires of the present invention.

As mentioned above a plurality of the composite superconducting wires described hereinbefore are passed through a molten bath of soft metal, then introduced into an atmosphere at a temperature lower than the solidifying temperature of the soft metal. During this process, the superconducting wires are assembled into a desired cross sectional shape by means of the molten soft metal deposited on the surface of the individual composite superconducting wires at latest before the deposited molten soft metal solidifies, then the deposited molten soft metal is made to solidify to obtain a large capacity superconducting wire.

In this case, a reducing die may be used at the time of taking out the superconducting wire from the bath. As for the strands in this connection, the composite superconducting wire of the present invention is desirable, but the strands which have been subjected to the heat treatment under the similar conditions as in the present invention to form the compound, as shown in FIG. 1-a, 1-b and 1-c may be used also. Further, if necessary, stabilized metal wires such as of Ag, Cu, Al and Au and reinforced wires such as of tungsten and stainless steel of same or different diameter as that of the strand containing the compound may be used. Further, fibrous reinforcement materials such as steel wool and carbon fiber may be floated in the molten soft metal and taken out together with the composite superconducting wire.

The manufacturing method of the present invention will described by referring to FIG. 10.

Firstly, the strands 21 which have been heat treated and having the superconducting compound layer in their inside are passed through the molten bath 17 of soft metal, through a die 22 of desired shape, taken out into a zone at a temperature lower than the melting point of the soft metal, and wound around the bobbin 23. As shown in the figure, the strands may be guided by a pulley 24 to predetermined position in the molten bath. The wire coming out of the dies are assembled into a stranded wire by the rotation of the winding bobbin 23 and the guide roller 24. And when the dies are of rectangular shape, wires of rectangular shape are obtained, and when a double-structured die (using a play floating etc.) is used a hollow conductor is obtained. In the above methods the following considerations should be given.

Firstly, as the strands have the superconducting compound, the bending radius of the strands should be more than the one determined by the strand outer diameter and the allowable strain in the portions of the strands which are bent during the whole process such as by the pulley 24 the winding bobbin 23, and near the dies 22. Secondly the dies should be large enough in comparison with the cross section of the wire to be obtained, and in case the cross section is of a circular shape, it is preferable to place a sheet such as of asbestos, carbon and glass on the surface of the molten metal bath instead of the squeezing dies, for reduction of entanglements such as of floating oxides. Thirdly, the strand pitch length of the stranded wires is desirable in the range 20 to 1000 times the strand diameter for similar reasons as in the case of the superconducting stranded wires as mentioned before.

The superconducting wires obtained by the present invention have naturally the properties inherent to the superconducting wires and yet have novel technical advantages in that the current capacity can optionally adjusted as desired and as the cross sectional shape can be selected as desired, that the wires of the present invention are very suitable for the production of a cable having a rectangular cross section and hollow conductors for large magnets.

Lastly, descriptions will be made on the method for lengthening the superconducting wires of the present invention and the method for jointing the wires. Although the compound superconductors superior to the alloy superconductors in respect of superconducting characteristics, they have a defect of being very brittle. It is required that the superconductors are uniform in their characteristics over several tens of thousands of meters of the wire in one continuous length, but it is difficult to produce the wire of continuous length without joints required for actual use, because of the limitations of the production technique and equipments. Therefore, the wires are jointed to obtain required lengths.

Therefore, the present invention is to provide a simple method of jointing the compound superconductors. The composite superconducting wires of the present invention can be jointed without any limitation so far as the allowable bending diameter is satisfied for the mechanical property of the compound.

The following four considerations should be given for jointing the superconducting wires. The contact resistance between the jointed wires should be low; the superconductivity can be maintained well against the variations of the current or the magnetic field, or against the mechanical vibration; the jointed portion should be compact enough for economical design of the magnet and its attachments; and the jointing operation should be simple and a high degree of reliability can be assured.

When the conventional jointing method for the tape shaped superconductors (the conductors are jointed by soldering using a normally conductive metal or directly jointed by plasma spray, etc.) is reexamined in view of the above, the tape shaped conductors have various defects in that their use is very complicated, that the joint space is large, the stability is poor due to the loose fixing of jointed portions, and they cannot be used for a permanent current.

According to the jointing method of the present invention, the superconducting wire 29 is fixed with a solder 30 on the metal plate 27 attached electrically independently to the outer portion of the bobbin flange 25 as shown in FIG. 11. This jointing can be effected by a very simple soldering operating without damaging the superconducting wires. Thus when the metal plates are put above another, the jointed portions can be used effectively.

The above jointing method are suitable for the ordinary magnet coilings. In this case the contact resistance is in the order of several nano ohms. For the application where the superconducting magnet is operated with permanent current (generally in the range of 1 to 0.1 nano ohm) the jointing method as shown in FIG. 12 is applied. In this case, the required length of two superconducting wires 35 and 36 are wound around the bobbin of a desired cross section so as to obtain a uniform winding, and the interstices between the wires, sometimes together with the bobbin, are filled with a soft metal 34 such as indium and heated to fix the jointed portions. According to this method, the current flows in all directions within the bobbin and the contact resistance is lower than one nano ohm, thus suitable for joints for permanent current.

EXAMPLE 1

55 holes with 3mm diameter were made on a brass base of 45mm diameter in a closely packed arrangement, and 55 vanadium bars with 3.05mm diameter and 90mm height were erected on the base with the lower portions of the bars being inserted in the hole. On the other hand a cast iron mold with 46mm diameter was preheated in an electric furnace to 600°C, then the above mentioned base with vanadium bars closely planted thereon was placed into said mold. Now, the results of investigation on the density of the cast ingot and the thickness of the reaction layer between CuGa and V in case of cast ingots with same size prepared at different molten metal temperatures and cooling conditions for the purpose of obtaining the optimum casting condition are shown in Table 1.

Table 1

| Temperature of molten metal(°C) | Cooling Condition quenching in water | Cooling Condition cooling in air | Density of Composites (g/cm³) | Thickness of Reaction layer between CuGa and V(μ) |
|---|---|---|---|---|
| 960 | done | no | 7.4 | <1 |
|  | no | done | 7.1 | 1.2 |
| 1000 | done | no | 8.1 | <1 |
|  | no | done | 8.2 | 2.1 |
| 1100 | done | no | 8.2 | <1 |
|  | no | done | 8.2 | 5.0 |
| 1200 | done | no | 8.15 | 1.7 |
|  | no | done | 8.2 | 7.5 |
| 1250 | done | no | 8.2 | 2.5 |
|  | no | done | 8.17 | 9.0 |

It is revealed from the above table that good results can be obtained at a molten metal temperature between of 1000°C and 1200°C, particularly between 1000°C and 1100°C when the cooling after the casting is done in water. Based on the above results, molten metal of Cu-19 atomic % Ga alloy at 1100°C was poured and cooled in water. The density of this cast ingot was examined by the X-ray penetration and ultrasonic flaw detection, and the ingot was found to be sound free from casting defects. Then, this cast ingot of 46mm diameter and 90mm length was heated and held at 800°C for 15 minutes, hot extruded to 10mm diameter, drawn and annealed in a repeated manner to obtain a wire of 0.12mm diameter. Seven strand wires were stranded into a stranded wire having a pitch of 8mm. Then the stranded wire was oxidized by heating in air at 650°C for 1 minute to form a thin oxide film, and subjected to heat treatment in vacuum of $10^{-4}$ Torr at 625°C for 50 hours in straight form.

Next, the stranded wire was immersed in a 30 wt.% nitric acid aqueous solution to remove the oxide film over the surface of the strand, and was dip coated with indium. Then in order to determine the effect of the cooling rate after the heat treatment on the critical current Ic, the stranded wires having a strand diameter of 0.12mm and 8mm stranding pitch were treated at various cooling rates and the results obtained are shown in Table 2. The results show the critical current Ic in case of water quenching and cooling in air is about ⅓ as compared with that in case of slow cooling, and the deviation in Ic value in case of quenching was 2 times or greater than that in case of slow cooling. Therefore, a cooling rate of not more than 1°C/min. after the heat treatment is desirable.

Table 2

| Cooling Conditions | Cooling Rate (°C/min.) | Ic(A)(70KG, average of 5 samples) |
|---|---|---|
| quenching in water | 2000°C/sec. or higher | 18 |
| cooling in air | 200 – 300°C/sec. (down to 300°C) | 23 |
| cooling in furnace | 50 – 200°C/sec. (down to 300°C) | 47 |
| slow cooling (1) | 1 (intermediately held at 540° for 10 hrs.) | 70 |
| slow cooling (2) | 1 | 68 |

EXAMPLE 2

The effects of the strand diameter on the critical current Ic were investigated. Compound superconducting stranded wire manufactured with the same composition and the same method as in Example 1 (CuGa - V strands of 0.12mm, 0.3mm, 0.4mm diameters were used) was wound around a bobbin with a diameter Do of 25mm, and the critical current density at 4.2°K in an external magnetic field of 70KG was measured, and it was revealed that the stranded wire of strands having 0.12mm diameter had the highest critical current density Jc of $7 \times 10^5 A/cm^2$. FIG. 13 shows the normalized critical results of density Jc of both stranded wires of strands having 0.3mm and 0.4mm diameter divided by the Jc ($7 \times 10^5 A/cm^2$) of the stranded wire with strands having 0.12mm diameter. With 0.3 to 0.4mm strand diameter, the compound formed in the strand was partially broken, resulting in degradation of superconducting characteristics and wide deviation.

EXAMPLE 3

The effects of the bending diameter and stranding pitch of a stranded wire on Ic were studied. Standed wires were made with the same composition and the same method as in Example 1. Pre-strain was given to the stranded wires of strands having a diameter of 0.12mm and stranding pitches of 1.5mm, 3.3mm, 7mm, 9.5mm, 25mm, 150mm, and their superconducting characteristics were measured. No degradation in the characteristics were observed up to 1.3% strain. Further when the critical current Ic was measured after the stranded wires were wound in several turns around bobbins of various diameters ($D_o$). The superconducting characteristics were degraded when the pitch was 5.0mm and 9.5mm at a bobbin diameter of 15mm or less. However, when the bobbin diameter was 25mm, the desired characteristics were sufficiently secured. These results are shown in FIG. 4. Next the above stranded wires were wound under a load of 1 kg around bobbins with 25mm diameter and Ic was measured in an external magnetic field of 70KG using 5 wire samples, and their mean values are shown in FIG. 5. From their results it is shown that the maximum Ic value exists at a stranding pitch (P) between 6mm and 12mm, and this means that the maximum point of the critical current value exits at the stranding pitch (P) zone of $D_o > 2P > D_o/2$. On the other hand the critical current value approaches a constant value when the stranding pitch is larger than 25mm, and this means that almost no stranding effect can be obtained and only similar result as in case of a parallelly assembled wire is obtained, when the stranding pitch is far more than 25mm.

EXAMPLE 4

Mechanical properties of the stranded wire was measured. The stranded wires were made with the same composition and the same process as in Example 1. The following samples 1 to 4 were prepared with composite strands in which 55 vanadium cores were embedded in the alloy matrix of Cu – 19 wt.% Ga:

1. Solid wire with a diameter of 0.36mm (conventional)
2. Stranded wire with 7 strands with a diameter of 0.12mm (comparative)
3. Stranded wire consisting of 6 composite strands with a diameter of 0.12mm and a tungsten wire with a diameter of 0.12mm which is not located at the center (comparative), and
4. Stranded wire consisting of strands with a diameter of 0.12mm and a tungsten wire with a diameter of 0.12mm located at the center (the present invention). In (2) to (4), the stranding pitch was 7mm.

These samples (1) to (4) were subjected to the same treatments as in Example 1, and the following tests were done therewith.

Critical current values in an external magnetic field of 70KG were measured on the samples as heat-treated, which were subjected to such deformation under the following conditions.

1. As heat-treated and without deformation.
2. Under a tensile load of 1 kg in straight form.
3. Wound under no load in a coil form of 20mm diameter.
4. Wound under tension of 1 kg in a coil form of 20mm diameter.

The results are compared in Table 3.

Table 3

| Sample No. | Ic (A) 70 KG (1) Conventional | (2) Comparative | (3) Comparative | (4) Present Invention |
|---|---|---|---|---|
| Deformation No. | | | | |
| 1) | 57 | 71 | 58 | 70 |
| 2) | 50 | 30 | 30 | 70 |
| 3) | 25 | 68 | 53 | 67 |
| 4) | 12 | 18 | 23 | 65 |

The above measurement results are a mean value of the five samples taken from the same lot, and the deviation in the critical current was ±3 amperes. It was revealed from the above results that the sample (1) is strong against the tensile load but very weak against the bending deformation, and the samples (2), (3) are strong against the bending deformation, but weak against the tensile deformation load, while the sample (4) is very strong against both the tensile load and the bending deformation.

EXAMPLE 5

The stranded wires with the structure (4) in Example 4 were heat-treated. Before the heat treatment, thermal expansion coefficients of the materials composing the stranded wire of the mild steel (herein called "iron") of the bobbin were shown in Table 4.

Table 4

| Samples | Thermal Expansion Coefficient | |
|---|---|---|
| CuGa-V | $15 \times 10^{-6}$ (20° – 250°C) | $8 \times 10^{-6}$ (250° – 600°C) |
| Fe | $(11.5 – 14.6) \times 10^{-6}$ (20 – 600°C) | |
| V | $(7.7 – 9) \times 10^{-6}$ (20 – 600°C) | |

Figure 16:
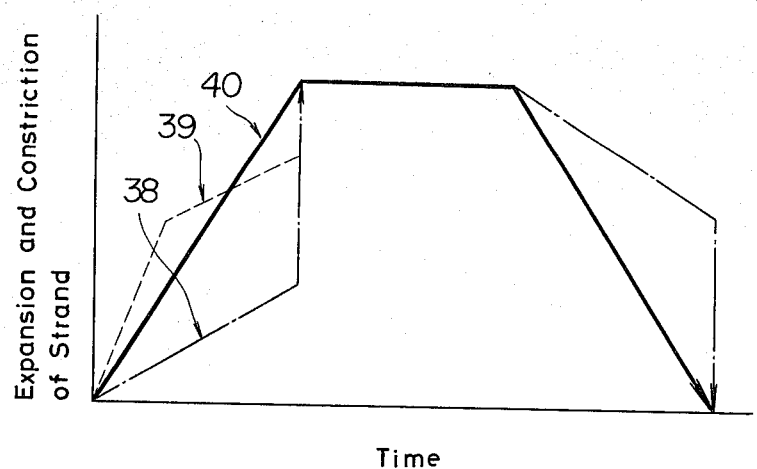
FIG. 16 shows thermal expansion and constriction behavior of a steel bobbin superconducting strand and tungsten wire.

When the stranded wires which were reinforced with a tungsten wire placed in the center were wound around the steel bobbins and heat-treated, the thermal expansion of the CuGa-V composite wire, the W-wire and the steel bobbin are schematically shown in FIG. 16 in a general diagram manner, wherein 38 is the tungsten wire, 39 is the CuGa - V composite wire, and 40 is the iron. While both the CuGa - V wire and W-wire were expanded by the thermal expansion of the iron bobbin at 625°C, the tungsten wire remained apart from the bobbin as in correspondence to the difference in thermal expansion caused by cooling between iron and tungsten. On the other hand as the CuGa - V strand shrinks more than the tungsten wire does, it tightens the tungsten wire. Therefore there is such a risk that the tungsten wire may jump out of place at certain portions of the stranded wire. The strain by heating the stranded wire due to the presence of different kinds of metals can not be virtually eliminated. It is necessary to disperse the strain uniformly in practical use. For this purpose, iron which has an intermediate thermal expansion value between W and CuGa-V was used as a bobbin material and the bobbin diameter was selected about 100mm from stand point of the unit strain amount. The unit strain amount per one turn in this case was 1.8under the heat-treated condition. Also, in order to prevent the stranded wires from adhering to each other as well as to the bobbin due to their being overlapped during winding, the iron wire and foil coated with fine particles of graphite which do not react with the stranded wire under the heat treatment temperature was used.

Next, the stranded wire and the iron wire (0.52mm diameter) were wound in parallel around the above mentioned iron bobbin (100mm diameter; 300mm length), with an iron foil (0.04mm thickness) inserted between layers, wherein the winding was done in as much as 12 layers, then the same heat treatment as in Example 1 was given to the wound bobbin. At the time of the unwinding after the heat treatment, no bonding or adhesion was observed, and the amount of residual thermal strain was uniformly absorbed in the gap between the iron wire and the iron foil, thus no remarkable collapsing nor waviness were noted. Next the oxide film on the long size stranded wire thus heat-treated was removed by a 30% nitric acid aqueous solution, then after passing it through a zinc-chloride flux solution, dipped in an indium bath to give indium coating. At this time of the indium coating fragments of indium were put into the zinc chloride flux solution to prevent deterioration of the flux by replacing increasing Cu ions with In ions, thus satisfactory indium coating was done continuously for a long length.

EXAMPLE 6

Explanations shall be made on the joint between stranded wires. A magnet having a coil with inner diameter of 30mm, outer diameter of 70mm and a length of 72mm was made using stranded wires having insulation coating of polyvinyl butyl alcohol. (PVBA). The stranded wire was composed of seven strands having a diameter of 0.12mm, and of the structure as in Example 4 and made by the method as in Example 1. Here, for making the hybrid magnet, such a brass bobbin 25 as shown in FIG. 11 (A) was made. A protruding part projecting 40mm and having an inner diameter of 20mm and a cross section of 25mm square was provided on the outside of the bobbin having an inner diameter of 20mm, drum diameter of 25mm, inner width of 70mm, flange thickness of 5mm, flange diameter of 80mm, wherein said protruding part serves for jointing.

Screw notches were provided at 2 places as shown in the drawing through the flange of the bobbin as far as the drum surface and the plane of the protruding part to lead in the superconductive current-lead wires. Also threads were provided at the center of the protruding part for fixing a connecting plate for the purpose of connection. Next the structure of the connecting plate was such that a 2mm copper plate having its both end parts caulked was attached to a bakelite plate 26 with length of 40mm, width of 30mm and thickness of 1mm in such a manner as providing 5mm space with the flange. This connection plate was fixed to the protruding part of the bobbin by a screw. The jointing operation was done to the notched part, while by removing a necessary amount of the insulating film on the superconducting wire taken out from the notched portion and by fixing the wire removed of the insulating film on the copper plate with indium solder. For jointing of the superconducting wire and the copper lead wire 31 in the innermost layer or the outermost layer, similar procedures as above may be applied. The outer diameter of the coil was 70mm. The cross sectional view of the connecting part thus made is shown in FIG. 11-$b$. Here, bakelite spacers 32 were inserted between the connecting plates for electrical insulation. Also the connecting part consisting of the bakelite plate 26 and the copper plate 27 had a semi-circular shape so that the space can be effectively utilized.

When 58 amperes current was flown to this magnet at 4.2°K, magnetic field of 72KG was generated. As the Ic of a short length wire of this stranded wire was 68A, the Ic of the coil reached 83% of that of the short length wire. No flux jump was noted in the magnet in the process of exciting, and the magnet did not show degradation in spite of several quenchings and functioned in a stable manner. This was achieved by the effect of a fined and twisted multicore, the effect of stabilization by pure indium coating and the effect of mechanical stabilization by a reinforcing wire.

EXAMPLE 7

Now, studies were made on a hybrid magnet and graphite coated wire. The stranded wire with a tungsten-core wire at the center and 7mm stranding pitch manufactured with the same composition and the same method as in Example 1 was baked with graphite on its surface prior to the heat reatment. The stranded wire thus obtained was very flexible as no adhesion was noted between the strands by the effect of the graphite. Insulation coating with polyvinyl butyl alcohol (PVBA) was given to the stranded wire to make a magnet. And a magnet with NbTi superconductive wire was provided around the outside of the magnet to make a hybrid magnet. The coil of the inner magnet had inner diameter of 25.2mm, outer diameter of 47.3mm and length of 109mm. The NbTi wire of the outer coil had 80 NbTi filaments of 27$\mu$ in the OFHC of 0.35mm diameter, and 5mm twist was given thereto. The outer magnet had inner diameter of 55.2mm, outer diameter of 112mm, and length of 160mm. As a result of a test, 60KG was generated by the outer NbTi magnet and 35KG was generated by the inner magnet, thus total of 95KG was generated. While the compound stranded wire coil was in such a state that each strand was insulated therebetween, almost the same characteristics (Ic, stability) as those of the indium coated wire in Example 1 was obtained.

EXAMPLE 8

For the purpose of reducing the resistance of the jointing part of a magnet below a predescribed resistance value for operating the magnet with almost permanent current, a magnet with the following jointing part was made. First, a bobbin 33 of high purity copper was made as shown in FIG. 12. It had dimensions of inner diameter of 1.5cm, drum diameter of 2cm, inner width of 1 cm, flange diameter of 3cm and flange thickness of 0.5cm. This bobbin was coated with indium thinnly beforehand, then two superconducting wires 35 were wound in parallel, and soldering with indium was done repeatedly on every one layer of winding until the wound portion reached the flange diameter, thus about 10m of the superconducting wire was used. The superconducting magnet thus obtained was operated to measure the damping of magnetic field and the resistance value was calculated from the inductance of the magnet and the value of $2 \times 10^{-9}$ ohm was obtained. Also when the resistance value of magnet 1 of Example 6 was measured in the same manner for comparison purpose and the value of $9 \times 10^{-7}$ ohm was obtained with resistance of $9 \times 10^{-6}$ ohm/cm per unit length of joint. On the other hand, the magnet 2 of Example 8 had $2 \times 10^{-6}$ ohm/cm, which is 1/4.5 of that of the magnet 1. This is believed to be due to the fact that the contact of the superconducting wire jointed was divided in all directions within the same layer that is, left and right, up and down.

EXAMPLE 9

100 copperclad niobium bars having an outer diameter of 5mm and 50%/50% areas of Cu and Nb were embedded in Cu - 10at.% Sn alloy matrix of 100mm diameter as in Example 1, then the obtained billet was hot extruded to obtain a composite bar with outer diameter of 20mm. Then the bar was drawn to 1.0mm with repeated intermediate annealing. A carbon coated stainless steel wire with outer diameter of 0.8mm and surface oxidized Ti foil of 30μ thickness were prepared.

Next, the composite wire was wound around a bobbin of 18 Cr- 8 Ni stainless steel flame-sprayed with ceramics, with the stainless steel wire between the turns and the Ti foil being intervened between the layers and a coil wth the outer diameter of 100mm, inner diameter of 25mm and length of 100mm was obtained. Then the coil was heat-treated for 50 hours at 700°C under vacuum to form $Nb_3Sn$ from Nb and Cu-Sn. While the heat-treated coil had some looseness between wires because of thermal expansion, it was fixed by vacuum impregnation of epoxy resin. When the superconducting magnet thus obtained was tested in liquid helium, a magnetic field of 101KG was generated.

EXAMPLE 10

A stranded wire with 0.36mm diameter, using 6CuGa - V wires of the same composition and made by same method as in Example 1 and W-core at its center, was drawn to obtain a round wire with 0.33mm diameter.

Figure 7:
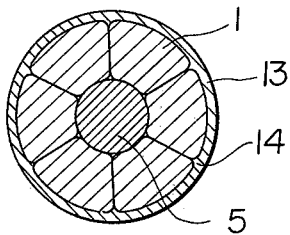
Figure 17:
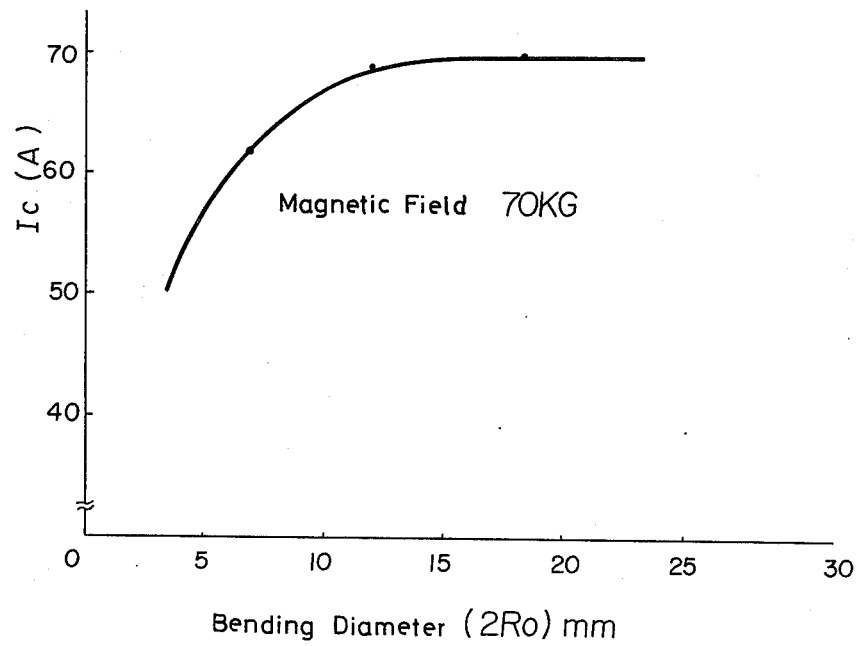
FIG. 17 shows the effect of the bending diameter on the critical current of the stranded compound wire with smooth surface.

Then the indium coating as in Example 2 was applied to the long length wire of the above obtained round wire shape stranded wire, it was held in air at 300°C for ½ hour, to form an oxide film on the indium coat to obtain round shape stranded wire as shown in FIG. 7. In FIG. 7, 14 is an oxidized indium film, 13 is indium, 1 is a superconducting strand and 5 is a tungsten wire. This stranded wire was wound with various bending diameters under 1 kg load, then Ic with 70KG was measured. The results thereof are shown in FIG. 17, wherein the degree of degradation of Ic was exactly same as in Example 1 shown in FIG. 4. Thus it was revealed that the round shape stranded wire had the characteristics of the standed wire with no deterioration.

Next, in order to make a magnet by said stranded wire a brass bobbin as shown in FIG. 11 of Example 6 was made. A protruding part projecting 40mm and having an inner diameter of 20mm and a cross section of 25mm square was provided outside the bobbin with an inner diameter of 20mm, drum diameter of 25mm, inner width of 70mm, flange thickness of 5mm and flange diameter of 72mm. The above mentioned stranded wire was wound around the bobbin and the same joint working as in Example 6 was given thereto to obtain a super-conducting magnet. Then the ampere turn was measured in order to obtain the insulating characteristics by the oxidized indium showing 97% of the perfect insulation at room temperature and showed a perfect insulation at 4.2°K. This revealed that it has satisfactory insulation characteristics. Further, the insulation layer was very thin as compared with that of conventional organic insulation thus contributing to improving the packing factor of coil. This superconducting magnet generated 76Kg as 62A current flowed at 4.2°K. As the Ic of the short sample of this stranded wire was 65A, the Ic of the coil was 95% of the Ic of the short sample. It was determined that the strands having smooth surface show little degradation, and the size of the magnet was smaller by 10% as compared with the conventional one.

EXAMPLE 11

6 superconducting compound wires with a diameter of 0.12mm of the same composition and made by the same process as in Example 1 and a stainless steel wire with the same diameter were passed independently through an indium bath at 250°C as shown in FIG. 10, then were passed through a die with bell part of 1.5mm diameter, bearing of 0.4mm diameter and length of 10mm, and were taken up around a rotating bobbin set near the die, and thus a primary stranded wire with outer diameter of 0.37mm and stranding pitch of 35mm was obtained. Next, seven of these primary stranded wires were passed through a die with a bell part of 5mm diameter, bearing of 1.2mm diameter and length of 10mm and were taken up around the rotating bobbin, and thus a secondary stranded cable with outer diameter of 1.15mm was obtained. PVBA insulation coating was given to the outside of the cable.

Then, a coil with an inner diameter of 55mm was made using the cable and a high magnetic field of 140KG was obtained at current of 235A under bias magnetic field of 100KG. No large flux jump was observed in the process of exciting the coil, and sufficient stability for practical use was confirmed.

EXAMPLE 12

Superconducting compound wires with 0.15mm diameter of the same composition and made by the same process as in Example 1 were subjected to an acid bath and were passed independently through an indium bath at 250°C, and through graphite cloth with a size of 1 mm × 4mm and thickness of 0.5mm over the surface of molten metal and thus rectangular cable with an outer size of 0.5mm × 2mm was obtained. Then polyethylene terephthalate Mylar (Trademark) tape was wound over the cable to provide insulation. The cross section of the cable is shown in FIG. 18. Wherein 20 is In, 41 is Mylar tape and 42 is a superconducting strand. A coil with an inner diameter of 50mm was made using said cable. When the critical current of the coil was measured under bias magnetic field of 100KG, 120KG was obtained at a current of 250A. No large flux jump was observed in a process of exciting the cable and no degradation was observed even with several quenchings.

EXAMPLE 13

The surface of a vanadium bar with 3.05mm × 90mm was oxidized in air at 400°C for 3 minutes as in Example 1. Thus oxidized bar was used to obtain CuGa-V cast block. Now the relationship between the molten metal temperature and the thickness of the reaction layer at the surface of CuGa and V was compared with that in case of the V-core with clean surface and results thereof are shown in Table 5. From the same it was revealed that the oxidized film on the vanadium surface prevented the reaction between V and Ga. As a result, subsequent drawing work was easy.

Table 5

| Temperature of molten metal(°C) | Reaction Thickness ($\mu$) of CuGa and V | | | | |
|---|---|---|---|---|---|
| | 960 | 1000 | 1100 | 1200 | 1250 |
| Sample | | | | | |
| Comparative (air cooling) | 1.2 | 2.1 | 5.0 | 7.5 | 9.0 |
| Present Invention (air cooling) | < 1 | < 1 | < 1 | 1.2 | 2.0 |

EXAMPLE 14

A vanadium bar with 6mm diameter was inserted into a pure copper pipe with outer diameter of 10mm and inner diameter of 6.05mm. And cold-swaging was given thereto to obtain a 5mm diameter bar. Then 19 of said bars were put upright in a casting mold with an inner diameter of 50mm and Cu — 19 at.% Ga alloy was cast thereinto then rapidly cooled to obtain a cast block, which was then hot extruded at 800°C to obtain a composite bar with outer diameter of 15mm. Then said bar was drawn to a 0.35mm diameter wire, with repeated (25 times) intermediate annealing at 600°C. The effect of the heat treatment (hot extrusion and annealing) was examined with an X-ray microanalyzer and the results are shown in FIG. 19. Numerals 43 and 44 show vanadium and gallium contents respectively. It was revealed that the Ga of the CuGa alloy was diffused into the copper layer around vanadium and that the reaction ($V_3Ga$) was not formed at the inter surface of the V and said copper layer, thus subsequent drawing was easy accomplished without trouble.

EXAMPLE 15

Seven Cu-Nb composite bars, with a Cu thickness of 1 mm and outer diameter of 10mm were inserted into holes bored in Cu - 10 at.% Sn alloy with outer diameter of 50mm and length of 200mm. Groove rolling and drawing were given to the billet with intermediate annealing at 500°C every 40% of cold working ratio to obtain composite wire with 0.5mm diameter. While the thickness of Cu in cross section of said wire was about 4$\mu$, and the thickness of the reaction layer outside copper was 6$\mu$. The following merits were obtained by covering Nb with Cu. (1) The fabrication the of Nb bar was very easy. And (2) the fabrication of the composite wire was very easy for the reason that the formation of $Nb_3Sn$ is supressed by the copper cladding.

EXAMPLE 16

Studies were made on a compound stranded wire with high electrical resistance layer. Cu — 19 at.% Ga alloy bar with 6.8mm diameter was covered with a vanadium tube with outer diameter of 10mm and inner diameter of 7mm. The obtained bar was inserted into an oxygen-free copper tube with outer diameter of 12mm and inner diameter of 10.2mm. The bars were reduced to 4.2mm diameter with repeating intermediate annealing at 600°C. Next, said bar was nickel-plated in a 200 thickness. Its cross sectional shape is shown in FIG. 20. 45 is the Ni-plating layer, 46 is copper, 47 is V, 48 is Cu — 20 Ga alloy. Next, said bar with 4.24mm diameter was inserted into an oxygen-free high conductivity copper tube with outer diameter of 55mm and inner diameter of 45mm, and a composite bar with no gap having 50mm diameter was obtained by drawing. Then the bar was cut to 90mm length and its outside was shaved to 45mm diameter to form a billet for extrusion, wherein the thickness of the oxygen-free copper at the outermost layer was about 1.5mm. Then similar extrusion, drawing, stranding, heat treatment, and insulation were given to the bar as in Example 1, and a stranded wire having a strand with such cross sectional shape as shown in FIG. 21 was obtained. $V_3Ga$ (51) was formed at the intersurface between V (49) and CuGa (50) while CuNi alloy (52) was formed at the intersurface between Ni and Cu. The Ic of said stranded wire was 46A at 70KG, and a coil with inner diameter of 20mm, outer diameter of 76mm, length of 100mm and wire density of 630 turn/cm² was wound with Mylar with 50$\mu$ thickness inserted between layers. This coil could generate 71KG at 37A, while no flux jump was observed and showed a stable function even at an exciting speed of 1KG/sec.

EXAMPLE 17

Ag was plated in about 10$\mu$ thickness on the surface of a CuGa - V wire with 0.12mm diameter of the same composition and made by the same method and heat-treated similarly as in Example 1, to form a $V_3Ga$ layer. As a comparison material, CuGa - V wire with no Ag plating was heat-treated under the same condition. The results were such that the $V_3Ga$ thickness of the Ag plated wire was 1.65$\mu$ while the comparison material had 1.15$\mu$. The Ic at 70KG was 13.5A in case of the Ag plated wire, and 10.1A in the comparison material.

EXAMPLE 18

A vanadium bar with 5mm diameter was inserted into a Cu — 5 at.% Ga alloy tube with inner diameter of 5.2mm and outer diameter of 6mm to make a composite wire with outer diameter of 3mm, and 55 of said wires were embedded into an Ag — 18.5 at.% Ga alloy bar, to obtain a wire with 0.12mm diameter by groove rolling and drawing. Then heat treatment was given in vacuum at 625°C for 50 hours as in Example 1 to form a $V_3Ga$ layer. The thickness of the $V_3Ga$ layer thus obtained was 2.1$\mu$. Thus the $V_3Ga$ layer was very thick as compared with the 1.15$\mu$ thick $V_3Ga$ layer in the comparative example in Example 17, while the critical current density Jc was about same.

EXAMPLE 19

A pure silver bar with 11.8mm diameter was inserted into a vanadium tube with outer diameter of 15mm and inner diameter of 12mm and thus the obtained composite tube was drawn to 12mm diamater. Next 4 of the composite bars were inserted into a vanadium tube with inner diameter of 30mm and outer diameter of 35mm and the vanadium tube inserted with the bars was drawn to make a composite wire of V - Ag with outer diameter of 21mm. And 30 of vanadium bars with 3.05mm diameter were erected with adequate space around the above mentioned V - Ag composite wire, then molten metal of Cu — 19 at % Ga alloy was poured thereinto to make a billet for extrusion with 45mm diameter. The cross section of said composite wire is shown in FIG. 22. 53 is V, 54 is CuGa, and 55 is pure silver. Next, the cross section of the strand of stranded wire obtained by the method of Example 1 is shown in FIG. 23. 56 is the silver core, 57 is a layer of the V tube remaining at non-reactive portion at the time of diffusion reaction, 58 is the Cu-Ga matrix, and 59 is the $V_3Ga$ compound layer formed by the diffusion reaction. As the V tube at the center was worked in contact with soft Ag, it is deformed in an irregular manner and may be broken during the working process and may diffuse out to be contaminated by the matrix elements. But by reinforcement with V, the thickness of V, serving as a shielding wall for the Ag and CuGa, became uniform and the prevention of contamination of the stabilizing material Ag was effected. Electric resistance of a silver wire having the same shape and heat-treated just as the above mentioned silver core 56 was measured at 4.2°K, and it was found that there was no substantial difference between the specific resistance of the silver core 56, thus it was confirmed that Cu, Ga, V did not diffuse into the silver core 56.

EXAMPLE 20

A copper bar was inserted into a tube of V— 1 at.% Zr alloy to obtain a composite bar with outer diameter of V of 3.05mm and diameter of inside copper of 1.5mm and Cu — 13 at.% Ga alloy was cast thereinto to make a composite material according to the method of Example 1. Next a $V_3Ga$ layer was formed by extrusion, drawing, stranding (pitch 7mm) and heat treatment as in Example 1. The cross section of the strand of this stranded wire is shown in FIG. 3-e. 60 is a copper core, 61 is a V - Zr alloy layer remaining at non-reacted portion during the heat treatment, 62 is a Cu - Ga alloy base, and 63 is $V_3Ga$. This stranded wire was insulated with PVBA after indium coating. Ic of this stranded wire was 70A at 70KG. A magnet having a coil with inner diameter of 30mm, outer diameter of 61mm, length of 72mm was made using the above mentioned coil. And when 68A current was passed to the magnet at 4.2°K, magnetic field with 72KG was generated. As a result it was confirmed that the stranded wire is satisfactory for practical uses.

What is claimed is:

1. A superconducting compound wire which comprises a plurality of strands having a superconducting compound therein, at least some of the strands having an inclination to the lengthwise direction of the superconducting wire and the strands being movable with respect to one another, said wire having a reinforcing material provided at least in the center portion of the superconducting wire selected from the group consisting of tungsten, molybdenum, stainless steel, glass, carbon, and alumina, in the form of a wire, and wherein the outer diameter of the strand is smaller than the product of the allowable bending diameter of the superconducting wire to be obtained and the strain limit for not degrading the superconducting characteristics of the strands and wherein the stranding pitch length of the strands is in the range of 20 to 1000 times of the strand outer diameter.

2. A superconducting compound wire which comprises a plurality of strands having a superconducting compound therein, at least some of the strands having an inclination to the lengthwise direction of the superconducting wire and the strands being movable with respect to one another, wherein the strands have a layer of material selected from the group consisting of niobium and vanadium closely adhering to the outside of an inner stabilizing material which is selected from the group consisting of copper, silver, aluminum and gold, a layer of superconducting compound selected from the group consisting of $Nb_3Sn$, $Nb_3Al$, $Nb_3(AlGe)$, $Nb_3Ga$, $V_3Ga$, $V_3Si$, $V_3Al$, $V_2Hf$ and $V_2Zr$, closely adhering to the outside of the niobium or vanadium layer, and a layer of elements other than niobium or vanadium which compose the compound or of an alloy containing such elements, the third layer closely adhering to the outside of the compound layer.

3. A superconducting magnet comprising a coil of superconducting compound wire which comprises a plurality of strands having a continuous phase of superconducting compound therein, at least some of the strands having an inclination to the lengthwise direction of the superconducting wire and the strands being movable with respect to one another, said wire having a reinforcing material in the form of a wire at least in the center portion thereof, said reinforcing material being selected from the group consisting of tungsten, molybdenum, stainless steel, glass, carbon, and alumina, and wherein the outer diameter of the strand is smaller than the product of the allowable bending diameter of the superconducting wire to be obtained and the strain limit for not degrading the superconducting characteristics of the strands and wherein the stranding pitch length of the strands is in the range of 20 to 1000 times of the strand outer diameter.

4. A stabilized superconducting compound wire according to claim 1, in which the exposed surface of at least the outermost strands of the assembled strands is coated with a soft metal.

5. A stabilized superconducting compound wire according to claim 4, in which the soft metal is selected from the group consisting of indium, tin and lead.

6. A stabilized superconducting compound wire according to claim 5, in which the soft metal has on its surface a layer of non-conductive compound of the soft metal for the insulation of the superconducting compound wire.

7. A composite superconducting wire according to claim 2, in which further a continuous phase of niobium or vanadium or their alloy is present in the inside of the stabilizing material.

8. A superconducting magnet according to claim 3, having a joint portion, wherein a plurality of the superconducting compound wires are wound together in a coil form and the interstices thereof are filled with solder.

9. A superconducting magnet according to claim 3, having a joint portion wherein a plurality of superconducting compound wires are fixed together on a metal plate provided outside the bobbin on which the wires are wound.

* * * * *